United States Patent
Yang et al.

(10) Patent No.: US 12,232,316 B2
(45) Date of Patent: Feb. 18, 2025

(54) BONDED MEMORY DEVICE AND FABRICATION METHODS THEREOF

(71) Applicant: YANGTZE MEMORY TECHNOLOGIES CO., LTD., Wuhan (CN)

(72) Inventors: Shengwei Yang, Wuhan (CN); Zhongyi Xia, Wuhan (CN); Kun Han, Wuhan (CN); Kang Li, Wuhan (CN); Xiaoguang Wang, Wuhan (CN); Hongbin Zhu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 568 days.

(21) Appl. No.: 17/100,852

(22) Filed: Nov. 21, 2020

(65) Prior Publication Data

US 2021/0104542 A1 Apr. 8, 2021

Related U.S. Application Data

(60) Division of application No. 16/231,481, filed on Dec. 22, 2018, now Pat. No. 11,114,453, which is a
(Continued)

(51) Int. Cl.
*H10B 43/27* (2023.01)
*H10B 43/40* (2023.01)

(52) U.S. Cl.
CPC ............. *H10B 43/27* (2023.02); *H10B 43/40* (2023.02)

(58) Field of Classification Search
CPC .................... H10B 43/27; H10B 43/40; H01L 2224/80895; H01L 25/18; H01L 21/187; H01L 21/185
See application file for complete search history.

(56) References Cited

U.S. PATENT DOCUMENTS 5,858,831 A * 1/1999 Sung ..................... H10B 99/00
257/E21.654
7,847,374 B1 * 12/2010 Wang .................... H10B 69/00
257/E21.613
(Continued)

FOREIGN PATENT DOCUMENTS

CN 101000880 A 7/2007
CN 101783314 A 7/2010
(Continued)

OTHER PUBLICATIONS

International Search Report issued in corresponding International Application No. PCT/CN2018/118705, mailed Aug. 28, 2019, 5 pages.
(Continued)

*Primary Examiner* — Jay C Kim
*Assistant Examiner* — Woo K Lee
(74) *Attorney, Agent, or Firm* — BAYES PLLC

(57) ABSTRACT

Embodiments of three-dimensional (3D) memory devices formed by bonded semiconductor devices and methods for forming the same are disclosed. In an example, a method for forming a semiconductor device is disclosed. The method includes the following operations. First, an insulating material layer can be formed over a substrate. In an example, single-crystalline silicon is not essential to the substrate. The insulating material layer can be patterned to form an isolation structure and a plurality of trenches in the isolation structure. A semiconductor material can be deposited to fill up the plurality of trenches to form a plurality of array-base regions in the isolation structure, the isolation structure insulating the plurality of array-base regions from one another. Further, a plurality of memory arrays can be formed over the plurality of array-base regions, and an insulating
(Continued)

structure can be formed to cover the plurality of memory arrays and the plurality of array-base regions.

14 Claims, 6 Drawing Sheets

Related U.S. Application Data continuation of application No. PCT/CN2018/118705, filed on Nov. 30, 2018.

(56) References Cited

U.S. PATENT DOCUMENTS

| | | | |
|---|---|---|---|
| 8,058,137 | B1 | 11/2011 | Or-Bach et al. |
| 9,449,987 | B1 | 9/2016 | Miyata et al. |
| 9,543,318 | B1 | 1/2017 | Lu et al. |
| 9,666,573 | B1 | 5/2017 | Sukekawa |
| 2004/0041265 | A1* | 3/2004 | Gonzalez ............. H01L 21/84 257/E21.65 |
| 2005/0151259 | A1 | 7/2005 | Hosoda et al. |
| 2006/0275962 | A1 | 12/2006 | Lee |
| 2007/0032084 | A1 | 2/2007 | Henley |
| 2008/0277778 | A1 | 11/2008 | Furman et al. |
| 2010/0109164 | A1 | 5/2010 | Kang et al. |
| 2012/0112358 | A1* | 5/2012 | Liang ............. H01L 25/0657 257/774 |
| 2013/0134383 | A1* | 5/2013 | Hwang ............. H10B 63/20 257/5 |
| 2013/0323908 | A1 | 12/2013 | Wang et al. |
| 2014/0151777 | A1 | 6/2014 | Sim et al. |
| 2017/0236746 | A1 | 8/2017 | Yu et al. |
| 2018/0261623 | A1 | 9/2018 | Higashi et al. |
| 2018/0277497 | A1 | 9/2018 | Matsuo |

FOREIGN PATENT DOCUMENTS

| | | | |
|---|---|---|---|
| CN | 101894771 | A | 11/2010 |
| CN | 102034804 | A | 4/2011 |
| CN | 102122636 | A | 7/2011 |
| CN | 102214649 | A | 10/2011 |
| CN | 102263041 | A | 11/2011 |
| CN | 102468284 | A | 5/2012 |
| CN | 102569228 | A | 7/2012 |
| CN | 102760726 | A | 10/2012 |
| CN | 103855166 | A | 6/2014 |
| CN | 104241508 | A | 12/2014 |
| CN | 107331679 | A | 11/2017 |
| CN | 107481997 | A | 12/2017 |
| EP | 1906441 | A1 | 4/2008 |
| JP | 2010123664 | A | 6/2010 |
| JP | 2011003645 | A | 1/2011 |
| JP | 2016062901 | A | 4/2016 |
| JP | 2018064758 | A | 4/2018 |

OTHER PUBLICATIONS

Written Opinion of the International Searching Authority issued in corresponding International Application No. PCT/CN2018/118705, mailed Aug. 28, 2019, 6 pages.

Supplementary European Search Report issued in corresponding European Application No. EP 18941819.7, dated Apr. 12, 2022, 11 pages.

* cited by examiner

BONDED MEMORY DEVICE AND FABRICATION METHODS THEREOF

CROSS REFERENCE TO RELATED APPLICATIONS

This application is division of U.S. application Ser. No. 16/231,481, filed on Dec. 22, 2018, entitled "BONDED MEMORY DEVICE AND FABRICATION METHODS THEREOF," which is continuation of International Application No. PCT/CN2018/118705, filed on Nov. 30, 2018, entitled "BONDED MEMORY DEVICE AND FABRICATION METHODS THEREOF," both of which are hereby incorporated by reference in their entireties.

BACKGROUND

Embodiments of the present disclosure relate to bonded three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of methods and structures for forming a wafer, and forming a bonded semiconductor structure with the wafer are disclosed herein.

In one example, a method for forming a bonded semiconductor device is disclosed. The method includes the following operations. First, a first wafer and a second wafer are formed. The first wafer can include a functional layer over a substrate. In an example, single-crystalline silicon is not essential to the substrate. The first wafer can be flipped to bond onto the second wafer to form the bonded semiconductor device so the substrate is on top of the functional layer. At least a portion of the substrate can be removed to form a top surface of the bonded semiconductor device. Further, bonding pads can be formed over the top surface.

In another example, a method for forming a semiconductor device is disclosed. The method includes the following operations. First, an insulating material layer can be formed over a substrate. In an example, single-crystalline silicon is not essential to the substrate. The insulating material layer can be patterned to form an isolation structure and a plurality of trenches in the isolation structure. A semiconductor material can be deposited to fill up the plurality of trenches to form a plurality of array-base regions in the isolation structure, the isolation structure insulating the plurality of array-base regions from one another. Further, a plurality of memory arrays can be formed over the plurality of array-base regions, and an insulating structure can be formed to cover the plurality of memory arrays and the plurality of array-base regions.

In still another example, a method for forming a semiconductor device is disclosed. The method includes the following operations. First, an insulating material layer can be formed over a substrate. in an example, single-crystalline silicon is not essential to the substrate. A semiconductor material layer can be formed over the insulating material layer. The semiconductor material layer can be patterned to remove portions of the semiconductor material layer, expose the other insulating material layer, and form a plurality of array-base regions. A same material as the insulating material layer can be deposited to fill in space formed by removed portions of the semiconductor material layer, connect with the insulating material layer, and form the isolation structure. A plurality of memory arrays can be formed over the plurality of array-base regions, and an insulating structure can be formed to cover the plurality of memory arrays and the plurality of array-base regions.

In a further example, a bonded semiconductor device is disclosed. The bonded semiconductor device includes a functional layer over a wafer. The function layer can include a plurality of array-base regions in an insulating structure, connected with and over a plurality of memory arrays. Dimensions of a top surface of each one of the plurality of array-base regions can be different from dimensions of a bottom surface. The functional layer can also include an isolation structure covering and insulating the plurality of array-base regions from one another.

In a different example, a wafer is disclosed. The wafer can include a functional layer over a substrate. The functional layer can include an isolation structure over a substrate. The isolation structure can surround and insulate a plurality of array-base regions from one another. The wafer can also include a plurality of memory arrays over the plurality of array-base regions. Dimensions of a top surface of each one of the plurality of array-base regions can be different from dimensions of a bottom surface. The wafer can further include an insulating structure covering the plurality of memory arrays and the plurality of array-base regions, and a plurality of interconnect structures over the plurality of memory arrays and in the insulating structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
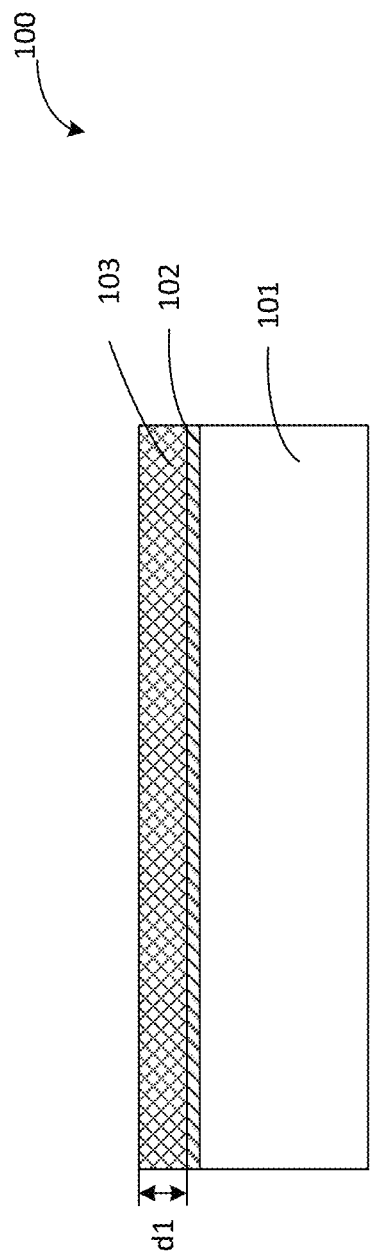
FIGS. 1A-1D each illustrates a cross-sectional view of an exemplary wafer at a different stage of an exemplary fabrication process, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate. As used herein, the x axis and the y axis (not shown) can each represent a horizontal direction and can be in a horizontal plane. The z axis can represent a vertical direction and can be perpendicular to the horizontal plane. The y axis is perpendicular to the x-z plane.

As used herein, the term "wafer" refers to a structure or device that can include any suitable parts such as a one or more substrates, various functional components in or over the substrates (e.g., memory arrays, peripheral circuits, semiconductor devices, interconnects, insulating structures, bonding pads, and/or wirings.) For example, an array-forming wafer refers to a structure that includes a substrate and a memory array formed over the substrate, a periphery-forming wafer refers to a structure that includes a substrate and peripheral circuits formed over the substrate, and a bonded wafer refers to the structure/device formed by the bonding of two wafers (e.g., an array-forming wafer and the periphery-forming wafer) or any two suitable devices/structures. The term "wafer" does not indicate the shape or function of the structure/device in description.

In fabrication of 3D memory devices, memory arrays and peripheral circuits can be formed on different wafers and can be bonded to form a bonded wafer. Memory arrays and peripheral circuits can be formed at the same time and can then be bonded to form the bonded memory device. This approach can have several advantages. First, peripheral circuits can be less susceptible to the fabrication process (e.g., chemicals and thermal treatment used in the fabrication) of the memory arrays. The fabrication of peripheral circuits can have higher yield, and the performance of the peripheral circuits can be improved. Also, the peripheral circuits and the memory arrays do not need to be formed on the same wafer, so more space can be used for forming each of memory arrays and peripheral circuits. Storage density can thus be kept sufficiently low to avoid complications caused by high storage density in the bonded memory device. Further, the memory arrays and the peripheral circuits can be fabricated at the same time or at different times, increasing the fabrication flexibility. For example, the memory arrays and the peripheral circuits can be fabricated at the same time and then bonded together to form the bonded memory device, decreasing the time for the overall fabrication process.

However, the fabrication process to form the bonded memory device may require two or more wafers, each including a single-crystalline substrate. The cost of the single-crystalline substrates can increase the fabrication cost to form the bonded memory device.

Various embodiments in accordance with the present disclosure provide structures of wafers for forming a bonded memory device and fabrication methods to form the structures and the bonded memory device. The disclosed structures and methods resolve the above-noted issues associated with increased fabrication cost. For example, by replacing the single-crystalline substrate of the wafer for forming memory arrays with a suitable low-cost substrate (e.g., substrate of a lower cost), the cost of the fabrication process to form the bonded memory device can be decreased. Meanwhile, memory arrays can be formed over polysilicon regions on top of the low-cost substrate to ensure desired functioning of the memory arrays. The low-cost substrate can be fully removed or partially removed (e.g., thinned or planarized) after the wafer for forming memory arrays and wafer for forming peripheral circuits are bonded together, having little or no impact on the bonded memory device. Other devices and/or structures can be formed over the bonded memory device after the full removal/partial removal of the low-cost substrate. Thus, fabrication cost to form the bonded memory device can be reduced without impairing the functioning of the bonded memory device.

Figure 1B:
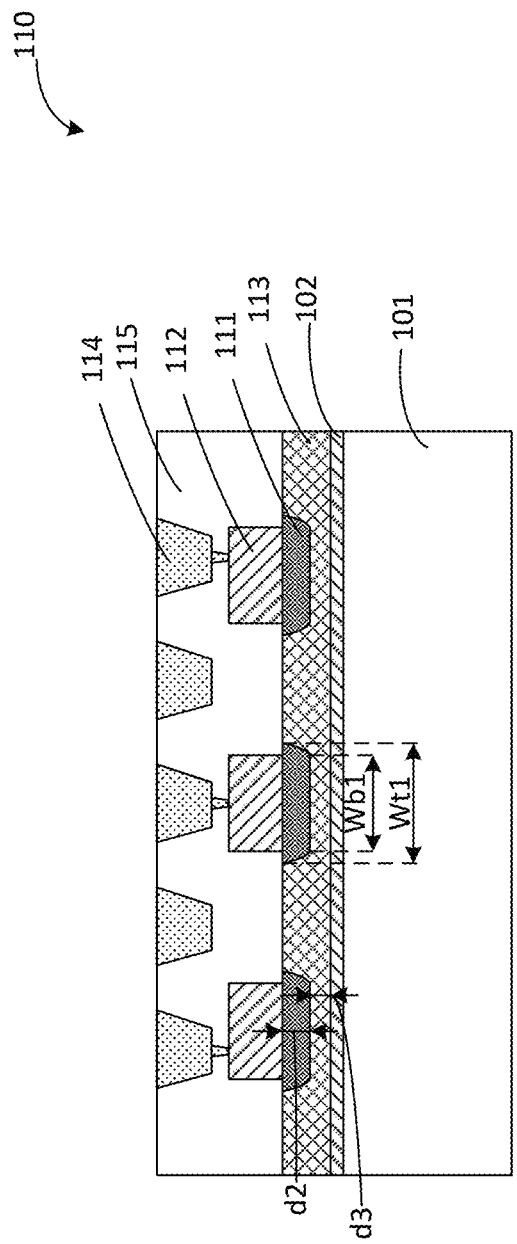
Figure 1C:
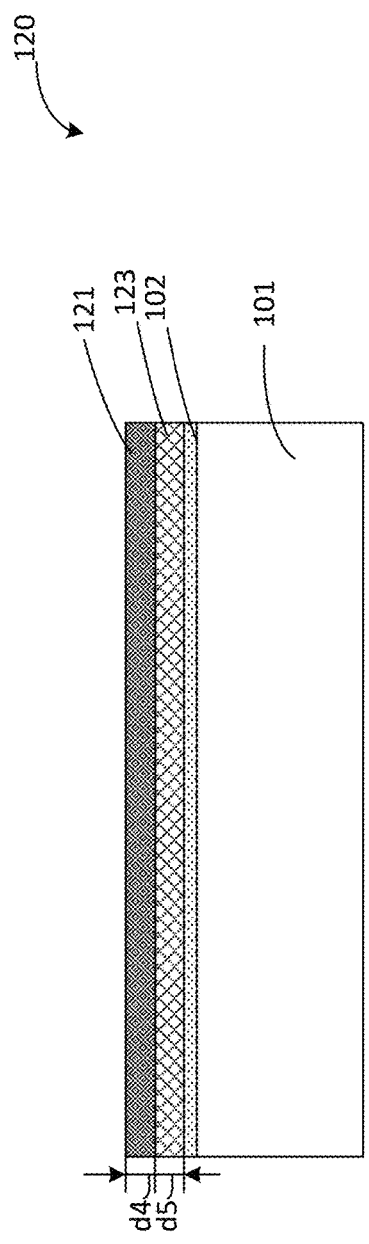
Figure 2A:
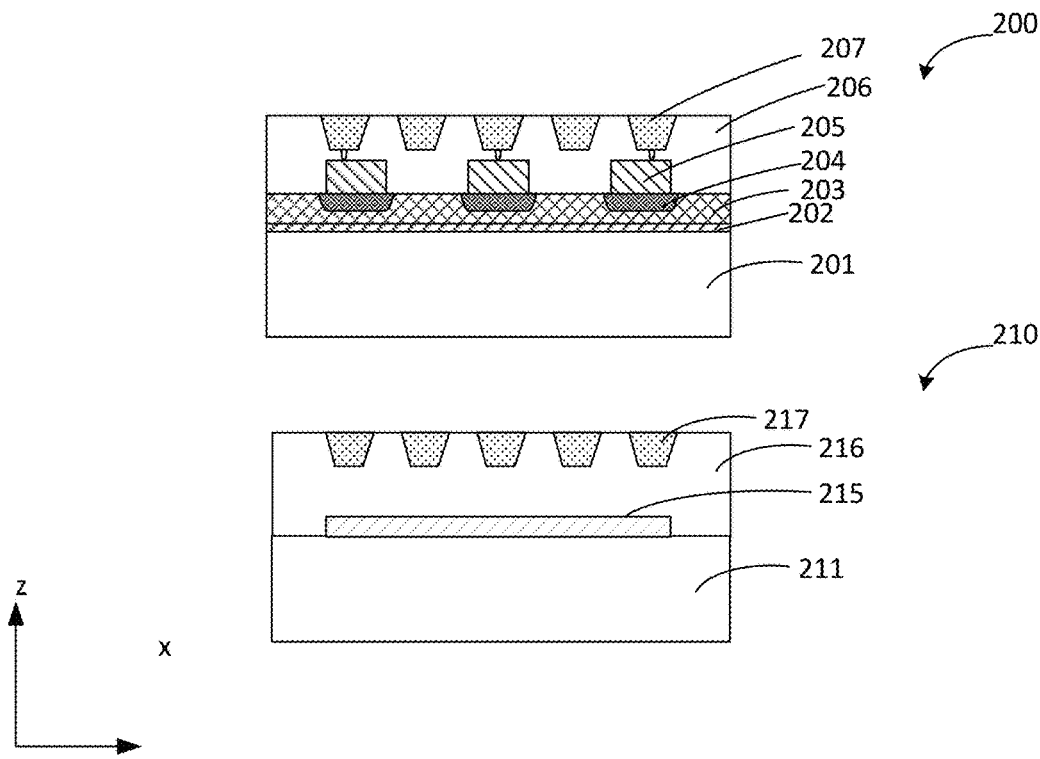
FIGS. 2A-2D each illustrates a cross-section view of an exemplary bonded wafer at a different stage of an exemplary fabrication process, according to some embodiments of the present disclosure.
Figure 2B:
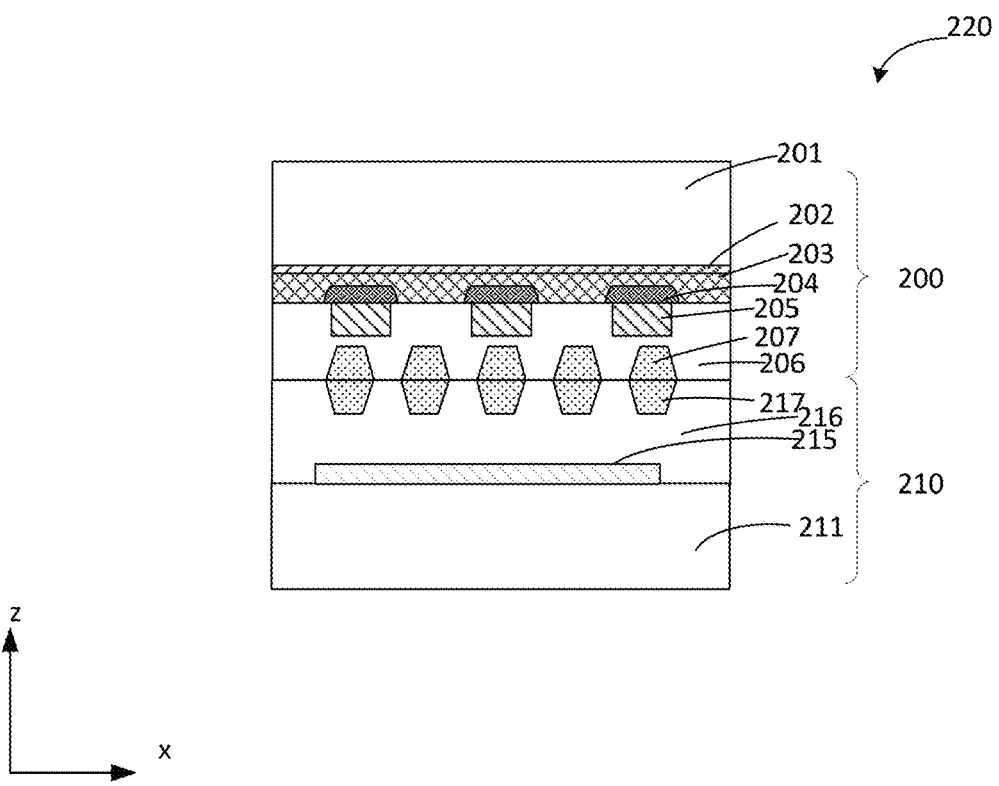
Figure 2C:
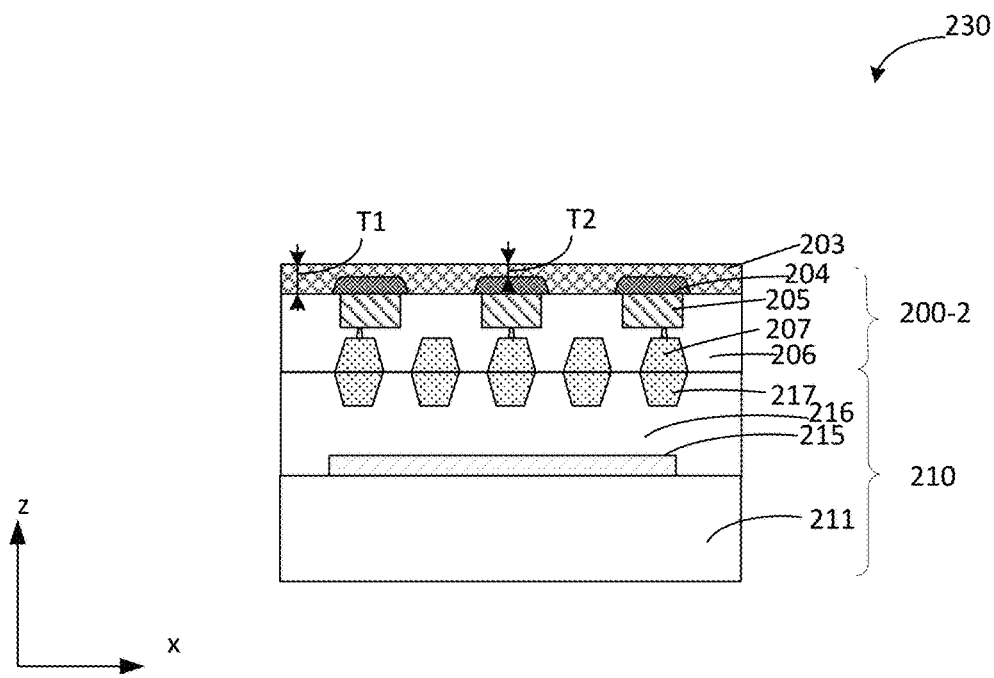
Figure 2D:
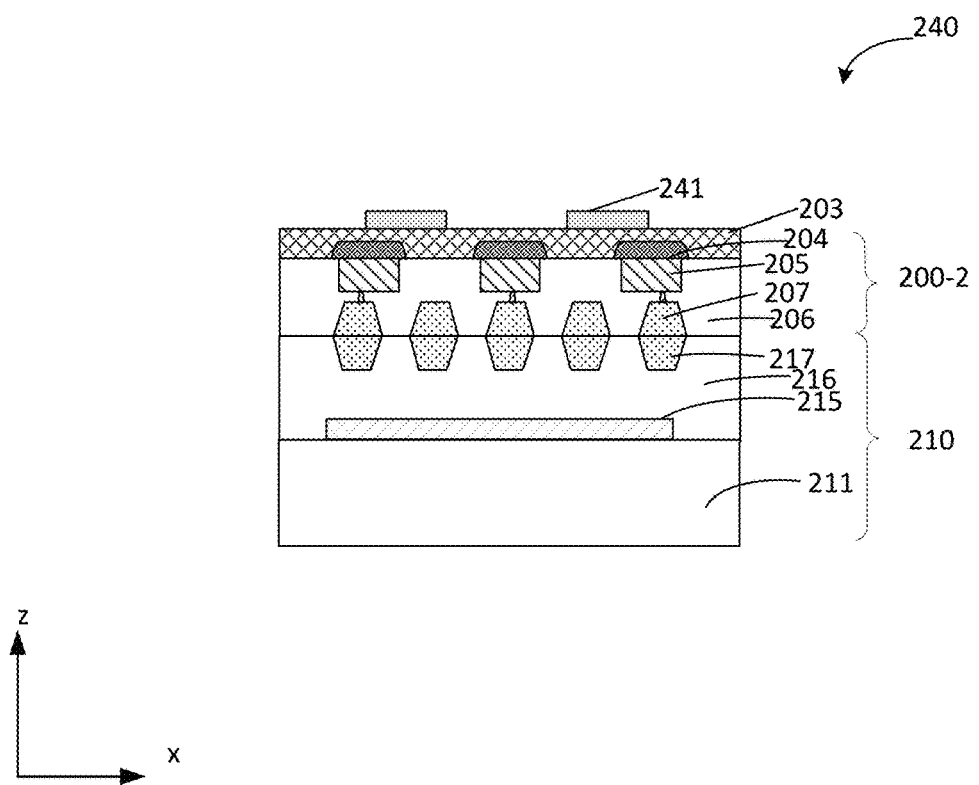
Figure 3A:
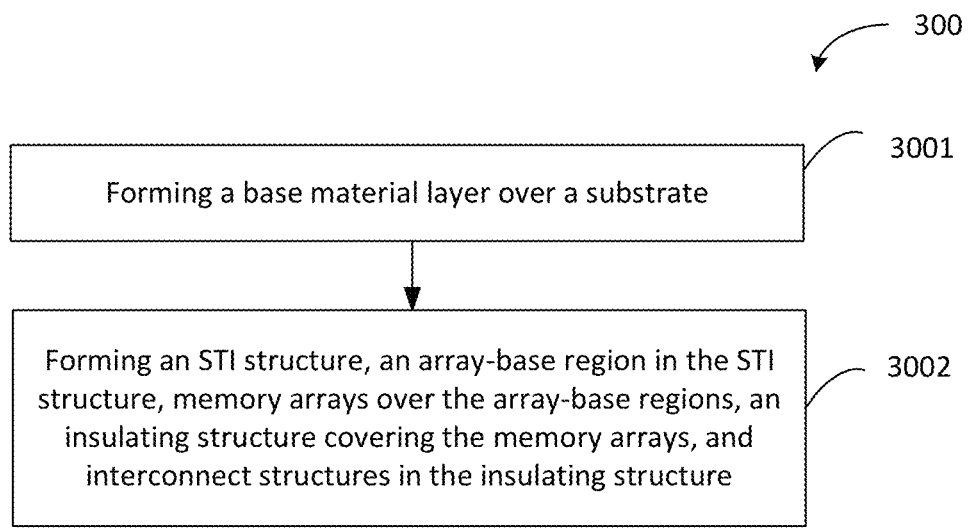
FIG. 3A illustrates an exemplary process flow to form an exemplary array-forming wafer, according to some embodiments of the present disclosure.
Figure 3B:
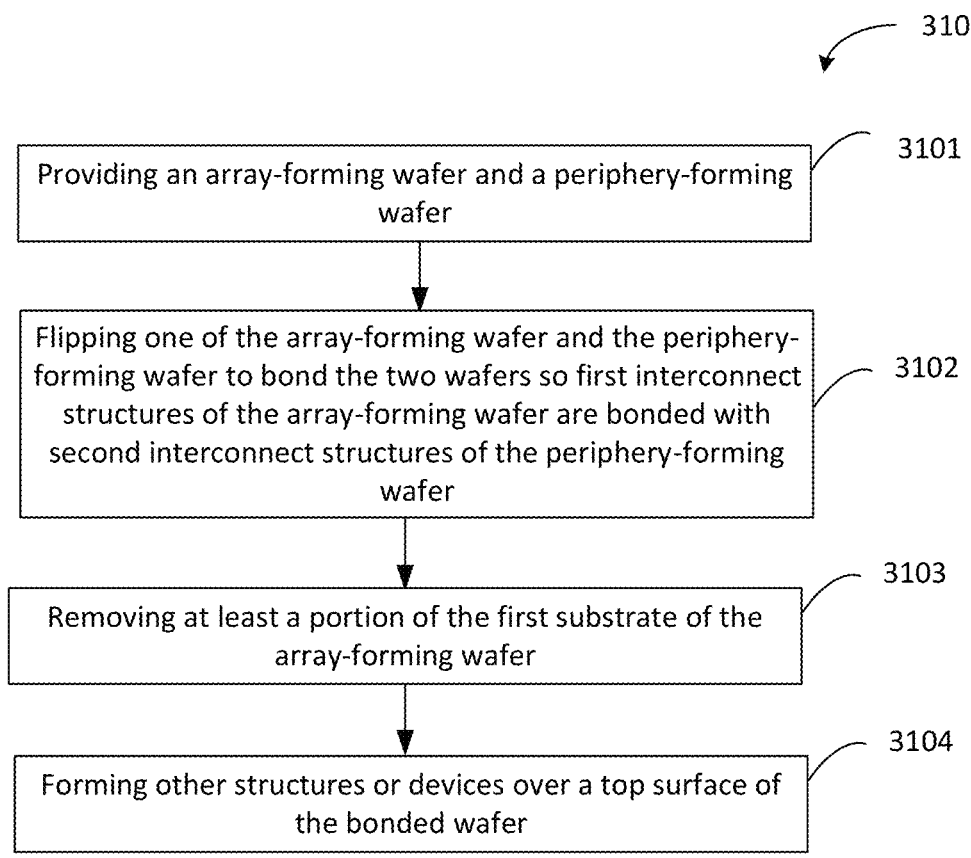
FIG. 3B illustrates an exemplary process flow to form an exemplary bonded wafer, according to some embodiments.

FIGS. 1A-1D each illustrates an exemplary array-forming wafer (e.g., the wafer for forming memory arrays) at a different stage of a fabrication process, according to embodiments of the present disclosure. FIGS. 2A-2D each illustrate structure of a bonded wafer at a different stage of a fabrication process, according to embodiments of the present disclosure. The bonded wafer illustrated in FIGS. 2A-2D can be formed with the array-forming wafer illustrated in FIGS. 1B and 1C. FIG. 3A illustrates an exemplary fabrication process 300 to form the array-forming wafer illustrated in FIGS. 1A-1D. FIG. 3B illustrates an exemplary fabrication process 310 to form the bonded wafer illustrated in FIGS. 2A-2D.

As shown in FIG. 3A, at the beginning of a fabrication process, a base material layer can be formed over a substrate (Operation 3001.) FIG. 1A illustrates a corresponding structure 100.

As shown in FIG. 1A, a base material layer 103 can be formed over a substrate 101. Substrate 101 can include any suitable substrate of which the top surface has sufficient stiffness, smoothness, and evenness. Substrate 101 can include a material that is easy to remove (e.g., easy to peel, etch away, and/or planarized). In some embodiments, substrate 101 includes a material that is of lower cost, commonly-used, and/or easier to fabricate. In some embodiments, substrate 101 does not include single-crystalline silicon. For example, substrate 101 can include poly-silicon, amorphous silicon, a mixture of poly and amorphous silicon, compound substrate, polymer substrate, glass, quartz, graphene, or a combination thereof. Base material layer 103 can include any suitable material that can provide electric insulation between functioning parts of array-forming wafer 100. For example, base material layer 103 can include silicon oxide (SiO), silicon nitride (SiN), and/or silicon oxynitride (SiON.) In some embodiments, base material layer 103 includes silicon oxide. Base material layer 103 may have a thickness of d1 along a direction perpendicular to the top surface of substrate 101 (e.g., vertical direction or the z axis.) To allow a sufficient portion of base material layer 103 to retain over substrate 101 for providing insulation between different parts, in some embodiments, thickness d1 is about 1 µm to about 5 µm, such as between 1 µm to about 5 µm. In some embodiments, thickness d1 is between about 1.5 µm to about 3 µm, such as between 1.5 µm and 3 µm (e.g., 1.5 µm, 1.8 µm, 2 µm, 2.5 µm, 3 µm, any range bounded by the lower end by any of these values, or in any range defined by any two of these values).

In some embodiments, array-forming wafer 100 includes a liner layer 102 positioned between substrate 101 and base material layer 103. Liner layer 102 can include a single-layered structure or a multiple-layered structure. Liner layer 102 can provide the base for the formation of base material layer 103. For example, base material layer 103 and substrate 101 can include different structures and/or different materials. To improve adhesion between base material layer 103 and substrate 101, improve surface condition of substrate 101 for the deposition of base material layer 103, and/or reduce the stress in base material layer 103, liner layer 102 can be formed over substrate 101, and base material layer 103 can be formed over liner layer 102. Base material layer 103 can then be deposited over substrate 101 with improved uniformity and stability. Liner layer 102 can include any material that can improve the adhesion and growth condition of base material layer 103 over substrate 101. For example, when base material layer 103 includes silicon oxide, liner layer 102 can include titanium nitride and/or titanium. The material composition of liner layer 102 can be dependent on the material selection of substrate 101 and base material layer 103. In some embodiments, liner layer 102 includes a multiple-layered structure that has one or more materials. In an example, the multiple-layered structure can gradually change the surface condition on which base material layer 103 is deposited on, further improving the growth of base material layer 103. The specific structure and properties of liner layer 102 should be determined based on the materials of substrate 101 and base material layer 103, and should not be limited by the embodiments of the present disclosure.

Base material layer 103 and liner layer 102 can be formed by any suitable deposition methods such as chemical vapor deposition (CVD), physical vapor deposition (PVD), and/or atomic layer deposition (ALD.) In some embodiments, substrate 101 is provided and a cleaning process is performed to remove any radicals or contamination on the top surface of substrate 101. Liner layer 102 and base material layer 103 can then be sequentially deposited over the top surface of substrate 101. In some embodiments, liner layer 102 includes titanium oxide and is formed by ALD. In some embodiments, base material layer 103 includes silicon oxide and is formed by CVD. Optionally, a surface planarization process is performed over base material layer 103 for subsequent formation of other structures/devices (e.g., memory arrays) over base material layer 103. The planarization process can include one or more of a recess etching process (dry/wet etching) and chemical mechanical polishing (CMP.)

Referring to FIG. 3A, after the base material layer is formed over the substrate, a shallow trench isolation (STI)

structure is formed based on the base material layer, and array-base regions can be formed in the STI structure. Memory arrays can be formed over the array-base regions. An insulating structure can be formed to cover the memory arrays and the array-base regions, and interconnect structures can be formed in the insulating structure (Operation 3002). FIGS. 1B and 1C each illustrates a corresponding structure 110 and 120.

As shown in FIG. 1B, one or more array-base regions 111 can be formed in a STI structure 113 to provide the base for formation of memory arrays 112. One or more memory arrays 112 can be formed over array-base region 111. In some embodiments, a thickness/depth d2 of array-base region 111 along the vertical direction (e.g., the z axis) is in a range of about 1 μm to about 3 μm, such as between 1 μm and 3 μm. In some embodiments, thickness/depth d2 is between about 1.2 μm to about 2.5 μm, such as between 1.2 μm and 2.5 μm (e.g., 1.2 μm, 1.5 μm, 1.8 μm, 2 μm, 2.5 μm, any range bounded by the lower end by any of these values, or in any range defined by any two of these values). In some embodiments, a distance d3 from the bottom of array-base region 111 to liner layer 102 (or substrate 101 if no liner layer 102 is formed) is in a range of about 1 μm to about 2 μm, such as between 1 μm and 2 μm. In some embodiments, distance d3 is between about 1.2 μm to about 1.8 μm, such as between 1.2 μm and 1.8 μm (e.g., 1.2 μm, 1.5 μm, 1.8 μm, any range bounded by the lower end by any of these values, or in any range defined by any two of these values). An insulating structure 115 can be formed to cover memory arrays 112 and array-base regions 111 so memory arrays 112 are in insulating structure 115 and can be electrically insulated from one another. One or more interconnect structures 114 can be formed in insulating structure 115 to connect desired devices/structures or connect memory array 112 with other devices/structures.

STI structure 113 can be formed by portions of base material layer 103 surrounding each array-base region 111 and insulating array-base regions 111 from, e.g., one another and from substrate 101. Array-base region 111 can include a suitable material or a suitable structure that provides the base for the deposition and fabrication of memory arrays 112. Array-base region 111 can have sufficient stiffness, surface evenness, and/or doping concentration for the proper operation of memory array 112. For example, array-base region 111 can include a doped semiconductor material and can function as a well region. In some embodiments, array-base region 111 includes doped (e.g., P type or N type) polysilicon, and the polarization of dopants is determined by, e.g., the polarization of source electrodes of memory array 112. In some embodiments, array-base region 111 includes P-type polysilicon.

STI structure 113 can be formed by removing portions of base material layer 103. The locations of the removed portions of base material layer 103 can correspond to the locations of array-base regions 111. Any suitable patterning/etching process can be performed to form STI structure 113. For example, a patterned photoresist layer can be formed over base material layer 103. The patterned photoresist layer can include openings that expose portions of base material layer 103 to be removed. A suitable etching process (e.g., wet/dry etching) can be performed to remove the exposed portions of base material layer 103 and form one or more trenches in base material layer 103. The locations of the trenches correspond to the locations of memory arrays 112. In some embodiments, an etching time of the etching process is controlled so a sufficient portion of base material layer 103 can retain between the bottom of a trench and the top surface of substrate 101/liner layer 102. The remaining portion of base material layer 103 can form STI structure 113.

A doped semiconductor material can be formed in the trenches to form array-base regions 111. In an example, polysilicon can be deposited to fill up the trenches. The polysilicon can be doped with suitable dopants by, e.g., an ion implantation process or an in-situ doping process. In some embodiments, P-type dopants such as boron, aluminum, indium, and/or gallium are doped into the polysilicon material to form array-base regions 111. In some embodiments, a width Wt1 of a top surface of array-base region 111 can be greater than a width Wb1 of a bottom surface of array-base region 111, along the x axis (or the horizontal plane.) Optionally, a surface planarization process is performed over STI structure 113 and array-base regions 111 to remove any excessive materials from the formation of array-base regions 111 and STI structure 113. The top surface of the planarized array-base regions 111 can be sufficient evenness and/or smoothness to facilitate subsequent formation of memory arrays 112. The planarization process can include one or more of a recess etching process (dry/wet etching) and CMP. The slurry used for the CMP can be determined based on, e.g., the material compositions and/or the surface areas/proportions of array-base regions 111 and/or STI structure 113. For example, the slurry can include agents that are predominantly used for planarizing the material of STI structure 113, if the surface areas of array-base regions 111 is sufficiently small (e.g., below a predetermined ratio) compared to the surface area of STI structure 113, and vice versa.

Memory arrays 112 can be formed over array-base region 111. For illustrative purposes, one memory array 112 is shown as an example over array-base region 111, as shown in FIG. 1B. In various embodiments, the number of memory arrays formed over array-base region 111 is determined by actual design/fabrication requirements. Memory array 112 can include any suitable devices/structures in which memory cells are formed. For example, memory array 112 can have one or more blocks extending along a direction parallel to the top surface of substrate (e.g., along the horizontal plane or the x-y plane,) and each memory block can have a plurality of memory cells. The specific structures of memory arrays 112 can be determined by different designs/fabrication requirements.

Memory arrays 112 can be formed by any suitable processes. In an example, a plurality of sacrificial material layers and a plurality of insulating material layers can be alternatingly deposited over STI structure 113 and array-base region 111 along the vertical direction to form a stack structure. Sacrificial material layers and insulating material layers can have different material compositions and can have same or different thicknesses. A patterned photoresist layer can be formed over the stack structure to expose portions of the stack structures to be removed. A suitable etching process (dry/wet etching) can be performed to remove the exposed portions of the stack structure to expose STI structure 113 and form array stacks in array-base regions 111. Each array block can undergo repetitive etches along the vertical direction (e.g., the z axis) to form a staircase structure. The staircase structures can be formed by, e.g., repetitively, forming an etch mask (e.g., patterned photoresist layer) over a respective stack structure to expose the portions of sacrificial material layers and insulating material layers to be removed and removing the exposed portions. The etch mask can be repetitively trimmed/etched to expose the portions of stack structure to be removed. Sacrificial layers and base material layers can be formed respectively by etching sacrificial material layers and insulating material layers. A staircase structure can then be formed. Semiconductor channels can be formed in the staircase structure to extend from a top surface of the staircase structure into array-base region 111. Source electrodes can be formed in the staircase structure, e.g., to divide the staircase structure into different memory blocks. Drain electrodes can be formed over the staircase structures. Gate electrodes (e.g., functioning as word lines) can be formed by replacing the sacrificial layers with suitable conductor layers such as tungsten, aluminum, cobalt, copper, and/or polysilicon (or conductor layers each surrounded by a high-k dielectric layer such as an aluminum oxide layer and/or a silicon oxynitride layer). Interleaved conductor layers and base material layers can stack along the vertical direction over array-base regions 111. The intersection of a gate electrode and a semiconductor channel can form a memory cell.

To form the semiconductor channel in the staircase structure, a plurality of channel holes can be formed in respective staircase structure. The plurality of channel holes can be formed by forming a patterned photoresist layer over the staircase structure. The patterned photoresist layer can include a plurality of openings that expose portions of the staircase structure. The locations of the exposed portions of the staircase structure can correspond to the locations of the semiconductor channels. An etching process can be performed to remove portions of the staircase structure exposed by the openings to expose substrate 101. Channel holes can be formed. Optionally, a recess etching process is performed to remove a portion of substrate 101 exposed at the bottom of a respective channel hole. Optionally, a suitable deposition process is performed to form a semiconductor portion at the bottom of the channel hole as part of the respective semiconductor channel. The semiconductor portion can contact the subsequently-formed channel-forming structure. The semiconductor portion can include a suitable semiconductor material such as polysilicon and the deposition process can include CVD, PVD, selective vapor deposition, and/or ALD. The thickness of the semiconductor portion along the vertical direction can be controlled to have a desired range. For example, the top surface of the semiconductor portion can be located between the last two conductor layers along the vertical direction. Optionally, a cleaning/recess etching process is performed to remove any excessive materials of the semiconductor portion on the sidewalls of channel holes before a channel-forming structure is filled in the channel holes.

After the semiconductor portion is formed in the channel hole, a channel-forming structure is formed to fill in each channel hole. The channel-forming structure can include, e.g., a blocking layer, a memory layer, a tunneling layer, a semiconductor layer, and a dielectric core, deposited sequentially from the sidewall of a respective channel hole to the center of the channel hole. Each one of the blocking layer, the memory layer, the tunneling layer, and the semiconductor layer can include a singled-layer structure or a multiple-layered structure. For example, the blocking layer can include a double-layered structure. The first blocking layer can include a dielectric metal oxide having a sufficiently high dielectric constant (e.g., greater than 7.9.) Examples of the first blocking layer include AlO, hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, and/or alloys thereof. The first blocking layer can be formed by a suitable deposition method such as chemical vapor deposition (CVD), atomic layer deposition (ALD), pulsed laser deposition (PLD), and/or liquid source misted chemical deposition. In some embodiments, the first blocking layer includes AlO. The second blocking layer can be formed over the first blocking layer and can include a dielectric material that is different from the first blocking layer. For example, the second blocking layer can include silicon oxide, silicon oxynitride, and/or silicon nitride. In some embodiments, the second blocking layer includes silicon oxide, which can be formed by any suitable conformal deposition method such as low pressure CVD (LPCVD), and/or ALD.

The memory layer can include a charge-trapping material and can be formed over the blocking layer. The memory layer can include conductive materials and/or semiconductor such as tungsten, molybdenum, tantalum, titanium, platinum, ruthenium, alloys thereof, nanoparticles thereof, silicides thereof, and/or polycrystalline or amorphous semiconductor materials (e.g., polysilicon and amorphous silicon.) The memory layer can also include one or more insulating materials such as SiN and/or SiON. In some embodiments, the memory layer includes a SiN layer sandwiched by SiON layers, which are further sandwiched by SiN layers. The memory layer can be formed by any suitable deposition method such as CVD, ALD, and physical vapor deposition (PVD). The tunneling layer can be formed over the memory layer and can include a single-layered structure or a multiple-layered structure and can include SiO, SiN, SiON, dielectric metal oxides, dielectric metal oxynitride, dielectric metal silicates, and/or alloys thereof. The tunneling layer can be formed by a suitable deposition method such as CVD, ALD, and/or PVD. In some embodiments, the tunneling layer includes a plurality of SiON layers and a SiO layer, wherein the plurality of SiON layers is positioned between memory layer 222 and the SiO layer.

The semiconductor layer can facilitate transport of charges and can be formed over the tunneling layer. The semiconductor layer can include one or more semiconductor materials such as a one-element semiconductor material, a III-V compound semiconductor material, a II-VI compound semiconductor material, and/or an organic semiconductor material. The semiconductor layer can be formed by any suitable deposition method such as LPCVD, ALD, and/or metal-organic chemical vapor deposition (MOCVD). In some embodiments, the semiconductor layer includes a poly-silicon layer. The dielectric core can include a suitable dielectric material and can fill up the space in surrounded by the semiconductor layer. In some embodiments, the dielectric core includes SiO (e.g., SiO of sufficiently high purity) and can be formed by any suitable deposition method such as CVD, LPCVD, ALD, and/or PVD. Optionally, a surface planarization process is performed over the staircase structures to remove any excessive materials from the formation of the semiconductor channels. The planarization process can include one or more of a recess etching process (dry/wet etching) and CMP. In various embodiments, the specific order to form different parts of memory array 112 and the structures of each part can be determined by design/fabrication requirements and should not be limited by the embodiments of the present disclosure.

An insulating structure 115 can then be formed to cover memory arrays 112 and array-base regions 111, and insulate memory arrays 112 and array-base regions 111 from other structures/devices. Insulating structure 115 can include any suitable dielectric materials such as silicon oxide and can be formed by a suitable deposition process such as CVD, PVD, and/or ALD. Optionally, a surface planarization process is performed over insulating structure 115 to planarize the top surface of insulating structure 115. The planarization process can include one or more of a recess etching process (dry/wet etching) and CMP.

Various interconnect structures 114 can be formed in insulating structure 115. For illustrative purposes, interconnect structures 114 are depicted as blocks in FIG. 1B. Interconnect structures 114 can represent any structures/devices (e.g., metal interconnects, contacts, and/or plugs) that conductively connect array-forming wafer 110 to another wafer/structure. For example, interconnect structures 114 can represent metal interconnects that extend from the top surface of insulating structure 115 to memory array 112 (e.g., the gate electrodes of memory array 112.) Interconnect structures 114 can include a suitable conductor material such as tungsten, cobalt, aluminum, and/or copper. In some embodiments, interconnect structures 114 can be formed by patterning/etching insulating structure 115 to form openings that connect the top surface of insulating structure 115 to desired parts of memory arrays 112, and filling the openings with a desired conductive material. The patterning/etching of the openings can be performed by any suitable etching process (e.g., wet/dry etching) and the formation of the conductive material can include any suitable deposition process such as CVD, PVD, sputtering, and/or ALD.

Figure 1D:
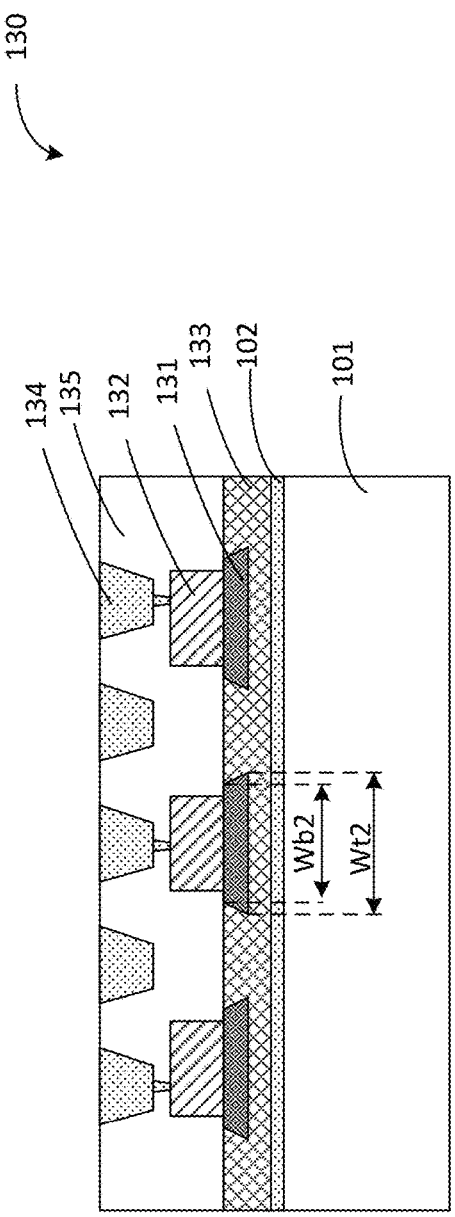

FIGS. 1C and 1D each illustrates another exemplary array-forming wafer at a different stage of another fabrication process, according to some embodiments. Compared to the structure and process associated with array-forming wafer 110, the STI structure and the array-base region of array-forming wafer 130 can be formed differently. In some embodiments, the structure and fabrication processes of a memory array 132, insulating structure 135, and interconnect structures 134 of FIG. 1C can be the same as or similar to memory array 112, insulating structure 115, and interconnect structures 114 of FIG. 1B. Same or similar substrate 101 and liner layer 102 can be used to form array-forming wafer 110.

As shown in FIG. 1C, a base material layer can be formed over substrate 101 (e.g., or over liner layer 102). Different from structure 100, the base material layer of FIG. 1C can include an insulating layer 123 over substrate 100 and an array-base layer 121 over insulating layer 123. The material composition of insulating layer 123 can be the same as or similar to base material layer 103, and the material composition of array-base layer 121 can be the same as or similar to array-base region 111. In some embodiments, array-base layer 121 includes polysilicon or doped polysilicon, and insulating layer 123 includes silicon oxide. A thickness d4 of array-base layer 121 can be the same as or similar to thickness/depth d2 or array-base region 111, and a thickness d5 or insulating layer 123 can be the same as or similar to distance d3. In some embodiments, thickness d4 and/or distance d5 can also be other desired values/ranges.

A patterning/etching process can be performed to form an array-base region 131 over insulating layer 123. For example, a patterned photoresist layer can be formed over array-base layer 121. The patterned photoresist layer can include openings that cover portions of array-base layer 121 to be retained to form array-base regions 131 and expose portions of array-base layer 121 to be removed. A suitable etching process (e.g., wet/dry etching) can be performed to remove the exposed portions of array-base layer 121 to expose insulating layer 123. The remaining portions of array-base layer 121 can form array-base regions 131. In some embodiments, a width Wt2 of a top surface of array-base region 131 can be less than a width Wb2 of a bottom surface of array-base region 131, along the x axis (or the horizontal plane.)

Further, an insulating material can be deposited to fill in the space formed by the removal of portions of array-base layer 121 (e.g., between array-base regions 131 and on the exposed portions of insulating layer 123.) In some embodiments, the insulating material is the same as or similar to the material of insulating layer 123, and can be formed by any suitable deposition process such as CVD, PVD, ALD, and/or selective vapor deposition. The insulating material can be deposited to fill up the space formed by the removal of portions of array-base layer 121 and connect with insulating layer 123. The structure formed by insulating layer 123 adjoining the insulating material can form an initial STI structure 133. Optionally, a surface planarization process is performed over STI structure 133 and array-base regions 131 to remove any excessive material from the formation of STI structure 133. The planarization process can include one or more of a recess etching process (dry/wet etching) and chemical mechanical polishing (CMP.) The slurry used for the CMP can be determined based on, e.g., the material compositions and/or the surface areas/proportions of array-base regions 131 and/or STI structure 133. For example, the slurry can include agents that are predominantly used for planarizing the material of array-base regions 131, if the surface area of STI structure 133 is sufficiently small compared to the surface area of array-base regions 131, and vice versa. Further, memory array 132, insulating structure 135, and interconnect structures 134 can be formed. The formation of these structures can be referred to the description of memory arrays 112, insulating structure 115, and interconnect structures 114.

Array-forming wafer 110/130 can be bonded with another structure/device through interconnect structures 114. In some embodiments, array-forming wafer 110/130 and a periphery-forming wafer (e.g., a wafer where peripheral circuits for the operation of memory devices are formed) can be bonded together to form a bonded wafer. Control signals/data can be applied on the peripheral circuits of the periphery-forming wafer to control the operation (e.g., read, write, and/or hold) of the memory arrays. FIGS. 2A-2D illustrate an exemplary process to form a bonded wafer with array-forming wafer 110/130 and a periphery-forming wafer. For viewing simplicity, an array-forming wafer similar to or the same as array-forming wafer 110 is depicted in FIGS. 2A-2D to describe the fabrication process.

As shown in FIG. 3B, at the beginning of the fabrication process, an array-forming wafer and a periphery-forming wafer can be provided (Operation 3101). FIG. 2A illustrate corresponding structures 200 and 210.

As shown in FIG. 2A, array-forming wafer 200 and periphery-forming wafer 210 can be provided. Array-forming wafer 200 can be the same as or similar to array-forming wafer 110 shown in FIG. 1B. Specifically, the fabrication processes and structures of substrate 101, liner layer 102, STI structure 113, array-base region 111, memory array 112, insulating structure 115, and interconnect structure 114 can be respectively similar to or the same as the fabrication processes and structures of a first substrate 201, a liner layer 202, a STI structure 203, an array-base region 204, a memory array 205, a first insulating structure 206, and a first interconnect structure 207.

Periphery-forming wafer 210 can include any devices/structures for operating memory arrays 205, by applying biases on memory array 205. Periphery-forming wafer 210 can include a second substrate 211, a device layer 215 formed over second substrate 211, a second insulating structure 216 over device layer 215, and a plurality of second interconnect structures 217 in second insulating structure 216.

Second substrate 211 can include any suitable material for providing a fabrication base for the formation of peripheral circuits. Second substrate 211 can include silicon (e.g., single crystalline silicon), silicon germanium (SiGe), gallium arsenide (GaAs), germanium (Ge), silicon on insulator (SOI), or any other suitable materials. In some embodiments, second substrate 211 is a thinned substrate (e.g., a semiconductor layer), which was thinned from a normal thickness by grinding, wet/dry etching and/or CMP. In some embodiments, second substrate 211 includes single-crystalline silicon.

Device layer 215 can represent any functional devices/structures that form the peripheral circuits in periphery-forming wafer 210. For example, device layer 215 can include digital, analog, and/or mixed-signal peripheral circuits used for facilitating the operation of the formed memory device. Second insulating structure 216 can cover device layer 215 to provide insulation between devices/structures of device layer 215 and between device layer 215 and other parts of periphery-forming wafer 210. Second insulating structure 216 can include any suitable dielectric materials such as silicon oxide, silicon nitride, and/or silicon oxynitride.

Second interconnect structures 217 can be formed in second insulating structure 216 and can be exposed to connect with the first interconnect structures 207. Second interconnect structures 217 can represent any structures/devices (e.g., metal interconnects, contacts, and/or plugs) that conductively connect periphery-forming wafer 210 to another wafer/structure. For example, second interconnect structures 217 can represent metal interconnects that extend from the top surface of second insulating structure 216 to device layer 215. Second interconnect structures 217 can include a suitable conductor material such as tungsten, cobalt, aluminum, and/or copper. In some embodiments, second interconnect structures 217 can be formed by patterning/etching second insulating structure 216 to form openings that connect the top surface of second insulating structure 216 to desired parts of device layer 215, and filling the openings with a desired conductive material. The patterning/etching of the openings can be performed by any suitable etching process (e.g., wet/dry etching) and the formation of the conductive material can include any suitable deposition process such as CVD, PVD, sputtering, and/or ALD. In some embodiments, the arrangement of second interconnect structures in second interconnect structure 217 (e.g., the dimensions of second interconnect structure and separation distance between second interconnect structures) can be consistent with the arrangement of first interconnect structures 207 so each first insulating structure 206 can be bonded with a corresponding second interconnect structure 217. Optionally, a surface planarization process is performed over second insulating structure 216 and second interconnect structures 217 to planarize the top surface of second insulating structure 216 and second interconnect structures 217. The planarization process can include one or more of a recess etching process (dry/wet etching) and CMP.

Array-forming wafer 200 and periphery-forming wafer 210 can be formed by different fabrication processes (e.g., separate fabrication processes). In some embodiments, array-forming wafer 200 and periphery-forming wafer 210 share the same fabrication operations at some fabrication stages, e.g., formation of first and second interconnect structures 207 and 217, and/or planarization processes. The specific processes to form array-forming wafer 200 and periphery-forming wafer 210 should be subjected to different designs/fabrication requirements and should not be limited by the embodiments of the present disclosure.

Referring to FIG. 3B, after the array-forming wafer and the periphery-forming wafer are provided, one of the wafers is flipped to bond onto the other wafer so first interconnect structures and the second interconnect structures are bonded with each other (Operation 3102). FIG. 2B illustrates a corresponding bonded wafer 220.

As shown in FIG. 2B, array-forming wafer 200 can be flipped to bond onto periphery-forming wafer 210. A bonded wafer or a bonded semiconductor device can be formed. That is, the bonded semiconductor device includes two wafers (e.g., array-forming wafer 200 and periphery-forming wafer 210) bonded together. Each first interconnect structure 207 can be bonded with a corresponding second interconnect structure 217. A suitable bonding process can be performed to form a bonding between array-forming wafer 200 and periphery-forming wafer 210. In some embodiments, array-forming wafer 200 and periphery-forming wafer 210 are bonded by hybrid bonding. In some embodiments, hybrid bonding allows first interconnect structures 207 to be bonded with second interconnect structures 217, and first insulating structure 206 to be bonded with second insulating structure 216. In some embodiments, pressure is applied to form bonding between first insulating structure 206 and second insulating structure 216, and heat is applied to form bonding between first interconnect structures 207 and second interconnect structures 217. In some embodiments, the surfaces of first insulating structure 206, second insulating structure 216, first interconnect structures 207, and second interconnect structures 217 have sufficient evenness so little or no space is formed between first insulating structure 206 and second insulating structure 216, and between first interconnect structures 207 and second interconnect structures 217 after bonding.

Referring back to FIG. 3B, after the array-forming wafer and the periphery-forming wafer are bonded together, at least a portion of the first substrate is removed (Operation 3103). FIG. 2C illustrates a corresponding bonded wafer 230.

As shown in FIG. 2C, at least a portion of first substrate 201 is removed. The remaining portion of array-forming wafer 200 is referred to as array-forming wafer 200-2, which is bonded onto periphery-forming wafer 210 to form bonded wafer 230. For illustrative purposes, first substrate 201 is shown to be removed completely in FIG. 2C. In some embodiments, first substrate 201 and liner layer 202 are removed to expose STI structure 203. In some embodiments, STI structure 203 is planarized or undergoes a recess etch so the thickness T1 of STI structure 203 along the vertical direction (e.g., the z axis) is in a range of about 1 μm to about 5 μm, such as between 1 μm and 5 μm. In some embodiments, thickness T1 is between about 1.5 μm to about 3 μm, such as between 1.5 μm and 3 μm (e.g., 1.5 μm, 1.8 μm, 2 μm, 2.5 μm, 3 μm, any range bounded by the lower end by any of these values, or in any range defined by any two of these values). The portion of STI structure 203 between the exposed surface and the bottom of array-base region 204 is sufficiently thick to insulate any device/structure (e.g., device/structure to be formed over the exposed surface of STI structure 203) from memory array 205. In some embodiments, T2 is in a range of about 1 μm to about 2 μm, such as between 1 μm and 2 μm. In some embodiments, T2 is between about 1.2 μm and about 1.8 μm, such as between 1.2 μm and 1.8 μm (e.g., 1.2 μm, 1.5 μm, 1.8 μm, any range bounded by the lower end by any of these values, or in any range defined by any two of these values). In some embodiments, a portion of first substrate 201 is retained over STI structure 203, e.g., for subsequent formation of other devices/structures. First substrate 201 can be referred to as being "thinned." The amount of material removed from first substrate 201 should be determined according to different design/fabrication requirements and should not be limited by the embodiments of the present disclosure.

The removal of first substrate 201 can include an etching process (e.g., dry/wet etching) and/or a CMP process. The etchant and/or slurry chosen for removing first substrate 201 should be determined based on the materials that form first substrate 201. In some embodiments, the etchant selectively etches first substrate 201 to STI structure 203.

Referring back to FIG. 3B, after the first substrate is removed or thinned, other structures or devices can be formed over a top surface of the bonded wafer (Operation 3104). FIG. 2D illustrates a corresponding bonded wafer 240.

As shown in FIG. 2D, other structures/devices such as one or more bonding pads 241 can be formed over the top surface of bonded wafer 240. Bonding pad 241 can be used for, e.g., wire bonding pad, bump attachment location, and/or electrical connection location. Bonding pad 241 can include any suitable material for different usages. For example, if bonding pad 241 is a wire bonding pad, bonding pad 241 can include a metal material such as aluminum, copper, and/or gold. Bonding pad 241 can be formed by any suitable methods such as depositing a layer of a desired bonding material (e.g., by CVD, sputtering, PVD, e-beam evaporation, and/or ALD) over bonded wafer 240 and patterning the deposited material layer (e.g., using a photolithography process and a follow-up etching process) to form bonding pad 241 of a desired pattern. In some embodiments, to improve adhesion between the bonding material and STI structure 203, another liner layer (e.g., an adhesive layer or a glue layer) can be formed between bonding pad 241 and STI structure 203. Other processes (e.g., more fabrication operations, wiring, and/or packaging) can be performed on bonded wafer 240.

In the present disclosure, an array-forming wafer is used as an example to illustrate the embodiments. It should be noted that, the disclosed structures and methods can be used to form any suitable wafer of which the substrate is thinned or removed in subsequent fabrication processes. The array-forming wafer can be an example of any suitable wafer with a functional layer over a substitute substrate, and the substitute substrate can include a structure/substrate that has sufficient evenness, stiffness, and/or smoothness for subsequent fabrication processes. The substitute substrate can be easy to remove (e.g., peel, etched away, and/or planarized) from the structures it is attached to, and can be of lower cost and/or easy to fabricate. The wafer can include memory arrays, circuits, semiconductor devices, and/or any other suitable structures/devices. Thus, the overall fabrication cost to form a bonded wafer can be reduced.

In some embodiments, a method for forming a bonded semiconductor device includes the following operations. First, a first wafer and a second wafer are formed. The first wafer can include a functional layer over a substrate. Single-crystalline silicon may not be essential to the substrate and the substrate may not include single-crystalline silicon. The first wafer can be flipped to bond onto the second wafer to form the bonded semiconductor device so the substrate is on top of the functional layer. At least a portion of the substrate can be removed to form a top surface of the bonded semiconductor device. Further, bonding pads can be formed over the top surface.

In some embodiments, forming the first wafer includes forming an isolation structure over the substrate and forming a plurality of array-base regions in the isolation structure. The isolation structure can insulate the plurality of array-base regions from one another. Forming the first substrate also includes forming a plurality of memory arrays over the plurality of array-base regions, forming an insulating structure to cover the plurality of memory arrays and the plurality of array-base regions, and forming a plurality of interconnect structures in the insulating structure and exposed at a top surface of the first wafer.

In some embodiments, forming the isolation structure and the plurality of array-base regions in the isolation structure includes forming an insulating material layer over the substrate, patterning the insulating material layer to form a plurality of trenches in the insulating material layer, and depositing a semiconductor material to fill up the plurality of trenches to form the plurality of array-base regions.

In some embodiments, forming the isolation structure and the plurality of array-base regions in the isolation structure include forming another insulating material layer over the substrate, forming a semiconductor material layer over the other insulating material layer, and patterning the semiconductor material layer to remove portions of the semiconductor material layer, expose the other insulating material layer, and form a plurality of array-base regions. Forming the isolation structure and the plurality of array-base regions in the isolation structure can also include depositing a same material as the other insulating material layer to fill in space formed by removed portions of the semiconductor material layer, connect with the other insulating material layer, and form the isolation structure.

In some embodiments, the method further includes performing a planarization process after formations of the plurality of array-base regions and the isolation structure to remove excessive materials thereon.

In some embodiments, forming the insulating material layer and the other insulating material layer includes depositing silicon oxide, and depositing the semiconductor material and forming the semiconductor material layer includes depositing doped polysilicon.

In some embodiments, forming the plurality of memory arrays over the plurality of array-base regions includes forming at least one memory array over each one of the plurality of array-base regions.

In some embodiments, forming the plurality of memory arrays over the plurality of array-base regions includes forming a staircase structure over each one of the plurality of array-base regions, forming a channel hole extending from a top surface of the staircase structure to the respective array-base region, and forming a semiconductor portion at a bottom of the channel hole. The semiconductor portion can be connected with the array-base region. Forming the plurality of memory arrays over the plurality of array-base regions can also include forming a channel-forming structure to fill up the channel hole and form a semiconductor channel.

In some embodiments, forming the semiconductor portion includes performing a deposition process to form a semiconductor material on an exposed portion of the respective array-base region at the bottom of the channel hole.

In some embodiments, the deposition process to form the semiconductor material includes depositing a material same as a material of the respective array-base region.

In some embodiments, the deposition process includes one or more of a chemical vapor deposition, physical vapor deposition, atomic layer deposition, and selective vapor deposition.

In some embodiments, the method further includes forming a plurality of gate electrodes in the staircase structure to be connected with the plurality of interconnect structures and to form a plurality of memory cells by intersection with the semiconductor channel.

In some embodiments, providing the second wafer includes providing a substrate with a plurality of other interconnect structures thereon.

In some embodiments, flipping the first wafer to bond onto the second wafer to form the bonded semiconductor device includes performing a hybrid bonding to bond the first wafer onto the second wafer so the interconnect structures of the first wafer are bonded with the plurality of other interconnect structures of the second wafer.

In some embodiments, the method further includes forming a liner layer between the isolation structure and the substrate.

In some embodiments, removing the at least a portion of the substrate includes one or more of an etching process, a peeling process, and a planarization process.

In some embodiments, a method for forming a semiconductor device includes the following operations. First, an insulating material layer can be formed over a substrate. Single-crystalline silicon may not be essential to the substrate and the substrate may not include single-crystalline silicon. The insulating material layer can be patterned to form an isolation structure and a plurality of trenches in the isolation structure. A semiconductor material can be deposited to fill up the plurality of trenches to form a plurality of array-base regions in the isolation structure, the isolation structure insulating the plurality of array-base regions from one another. Further, a plurality of memory arrays can be formed over the plurality of array-base regions, and an insulating structure can be formed to cover the plurality of memory arrays and the plurality of array-base regions.

In some embodiments, the method of further includes performing a planarization process after formations of the plurality of array-base regions and the isolation structure to remove excessive materials thereon.

In some embodiments, forming the insulating material layer includes depositing silicon oxide, and depositing the semiconductor material includes depositing doped polysilicon.

In some embodiments, a method for forming a semiconductor device includes the following operations. First, an insulating material layer can be formed over a substrate. Single-crystalline silicon may not be essential to the substrate and the substrate may not include single-crystalline silicon. A semiconductor material layer can be formed over the insulating material layer. The semiconductor material layer can be patterned to remove portions of the semiconductor material layer, expose the other insulating material layer, and form a plurality of array-base regions. A same material as the insulating material layer can be deposited to fill in space formed by removed portions of the semiconductor material layer, connect with the insulating material layer, and form the isolation structure. A plurality of memory arrays can be formed over the plurality of array-base regions, and an insulating structure can be formed to cover the plurality of memory arrays and the plurality of array-base regions.

In some embodiments, the method further includes performing a planarization process after formations of the plurality of array-base regions and the isolation structure to remove excessive materials thereon.

In some embodiments, forming the insulating material layer includes depositing silicon oxide, and forming the semiconductor material layer includes depositing doped polysilicon.

In some embodiments, a bonded semiconductor device includes a functional layer over a wafer. The function layer can include a plurality of array-base regions in an insulating structure, connected with and over a plurality of memory arrays. Dimensions of a top surface of each one of the plurality of array-base regions can be different from dimensions of a bottom surface. The functional layer can also include an isolation structure covering and insulating the plurality of array-base regions from one another.

In some embodiments, the isolation structure includes silicon oxide and the plurality of array-base regions includes doped polysilicon.

In some embodiments, the plurality of memory arrays includes a staircase structure with a semiconductor channel and the semiconductor channel includes a semiconductor portion connected with a respective array-base region and a channel-forming structure over the semiconductor portion. The semiconductor portion can include polysilicon.

In some embodiments, the plurality of memory arrays further includes a plurality of gate electrodes intersecting with the semiconductor channel to from a plurality of memory cells.

In some embodiments, the functional layer is bonded to the wafer by bonding to another isolation structure over a substrate, and the bonding includes a first bonding between a plurality of interconnect structures in the isolation structure and a plurality of other interconnect structures in the other isolation structure and a second bonding between the isolation structure and the other isolation structure.

In some embodiments, the wafer further includes a device layer over the substrate and in the other isolation structure, the device layer being connected with the plurality of other interconnect structures. In some embodiments, the memory arrays are connected with the plurality of interconnect structures.

In some embodiments, the bonded semiconductor device further includes a bonding pad over the isolation structure.

In some embodiments, a wafer can include a functional layer over a substrate. The functional layer can include an isolation structure over a substrate. The isolation structure can surround and insulate a plurality of array-base regions from one another. The wafer can also include a plurality of memory arrays over the plurality of array-base regions. Dimensions of a top surface of each one of the plurality of array-base regions can be different from dimensions of a bottom surface. The wafer can further include an insulating structure covering the plurality of memory arrays and the plurality of array-base regions, and a plurality of interconnect structures over the plurality of memory arrays and in the insulating structure.

In some embodiments, the isolation structure includes silicon oxide and the plurality of array-base regions comprise doped polysilicon.

In some embodiments, the plurality of memory arrays each includes a staircase structure with a semiconductor channel, and the semiconductor channel includes a semiconductor portion connected with a respective array-base region and a channel-forming structure over the semiconductor portion. The semiconductor portion can include polysilicon.

In some embodiments, the plurality of memory arrays further includes a plurality of gate electrodes intersecting with the semiconductor channel to from a plurality of memory cells.

In some embodiments, a thickness of the plurality of array-base regions is in a range of about 1 μm to about 3 μm; and a distance between a bottom surface of the plurality of array-base regions to the substrate is in a range of about 1 μm to about 2 μm.

In some embodiments, the insulating structure includes silicon oxide and the plurality of interconnect structures comprise copper.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor device, comprising:
    forming an insulating material layer over a substrate, wherein the substrate does not include single-crystalline silicon;
    patterning the insulating material layer to form an isolation structure and a plurality of trenches in an upper portion of the isolation structure;
    depositing a semiconductor material to fill up the plurality of trenches to form a plurality of array-base regions in the upper portion of the isolation structure, wherein the isolation structure is located between adjacent array-base regions and between the plurality of array-base regions and the substrate for electrically insulating the plurality of array-base regions from one another and from the substrate;
    forming a plurality of memory arrays over the plurality of array-base regions;
    forming an insulating structure to cover the plurality of memory arrays and the plurality of array-base regions;
    forming a plurality of interconnect structures in the insulating structure;
    bonding a peripheral structure including peripheral circuits to the insulating structure;
    after the bonding, removing the substrate to expose the isolation structure; and
    forming bonding pads on the isolation structure.

2. The method of claim 1, further comprising performing a planarization process after formations of the plurality of array-base regions and the isolation structure to remove excessive materials thereon.

3. The method of claim 1, wherein forming the insulating material layer comprises depositing silicon oxide; and depositing the semiconductor material comprises depositing doped polysilicon.

4. A method for forming a semiconductor device, comprising:
    forming an insulating material layer over a substrate, wherein the substrate does not include single-crystalline silicon;
    forming a semiconductor material layer over the insulating material layer;
    patterning the semiconductor material layer to remove portions of the semiconductor material layer, expose the insulating material layer, and form a plurality of array-base regions;
    depositing a same material as the insulating material layer to fill in space formed by removed portions of the semiconductor material layer, connect with the insulating material layer, and form an isolation structure between adjacent array-base regions and between the plurality of array-base regions and the substrate for electrically insulating the plurality of array-base regions from one another and from the substrate;
    forming a plurality of memory arrays including vertically stacked memory cells over the plurality of array-base regions;
    forming an insulating structure to cover the plurality of memory arrays and the plurality of array-base regions;
    forming a plurality of interconnect structures in the insulating structure;
    bonding a peripheral structure including peripheral circuits to the insulating structure;
    after the bonding, removing the substrate to expose the isolation structure; and
    forming bonding pads on the isolation structure.

5. The method of claim 4, further comprising performing a planarization process after formations of the plurality of array-base regions and the isolation structure to remove excessive materials thereon.

6. The method of claim 4, wherein forming the insulating material layer comprises depositing silicon oxide; and forming the semiconductor material layer comprise depositing doped polysilicon.

7. The method of claim 1, wherein the peripheral structure comprises:
    a second substrate;
    a device layer over the second substrate and including the peripheral circuits;
    a second insulating structure over the device layer; and
    a plurality of second interconnect structures in the second insulating structure.

8. The method of claim 7, wherein bonding the peripheral structure comprises:

hybrid bonding the second insulating structure with the insulating structure, such that the plurality of second interconnect structures are connected with the plurality of interconnect structures.

9. The method of claim 1, wherein forming the plurality of memory arrays comprises forming a memory array over each array-base region.

10. The method of claim 9, wherein forming the memory array comprises:
   forming a stack structure over each array-base region;
   forming channel holes each extending through the stack structure to the array-base region;
   forming a semiconductor portion at a bottom of each channel hole and in contact with the array-base region; and
   forming a channel structure in each channel hole.

11. The method of claim 4, wherein the peripheral structure comprises:
   a second substrate;
   a device layer over the second substrate and including the peripheral circuits;
   a second insulating structure over the device layer; and
   a plurality of second interconnect structures in the second insulating structure.

12. The method of claim 11, wherein bonding the peripheral structure comprises:
   hybrid bonding the second insulating structure with the insulating structure, such that the plurality of second interconnect structures are connected with the plurality of interconnect structures.

13. The method of claim 4, wherein forming the plurality of memory arrays comprises forming a memory array over each array-base region.

14. The method of claim 13, wherein forming the memory array comprises:
   forming a stack structure over each array-base region;
   forming channel holes each extending through the stack structure to the array-base region;
   forming a semiconductor portion at a bottom of each channel hole and in contact with the array-base region; and
   forming a channel structure in each channel hole.

* * * * *